United States Patent
Randolph et al.

(10) Patent No.: US 8,778,804 B2
(45) Date of Patent: Jul. 15, 2014

(54) HIGH SELECTIVITY, LOW DAMAGE ELECTRON-BEAM DELINEATION ETCH

(75) Inventors: Steven Randolph, Portland, OR (US); Clive D. Chandler, Portland, OR (US)

(73) Assignee: FEI Company, Hillsboro, OR (US)

( * ) Notice: Subject to any disclaimer, the term of this patent is extended or adjusted under 35 U.S.C. 154(b) by 117 days.

(21) Appl. No.: 12/363,376

(22) Filed: Jan. 30, 2009

(65) Prior Publication Data
US 2010/0197142 A1    Aug. 5, 2010

(51) Int. Cl.
*H01L 21/311*  (2006.01)
*H01L 21/302*  (2006.01)
*H01L 21/306*  (2006.01)
*H01L 21/3065* (2006.01)

(52) U.S. Cl.
CPC .......... *H01L 21/306* (2013.01); *H01L 21/3065* (2013.01)
USPC .......................................... 438/695; 438/735

(58) Field of Classification Search
USPC ....................................................... 438/695
See application file for complete search history.

(56) References Cited

U.S. PATENT DOCUMENTS

| | | | |
|---|---|---|---|
| 4,226,666 A | 10/1980 | Winters et al. | |
| 5,055,696 A | 10/1991 | Haraichi et al. | |
| 5,435,850 A | 7/1995 | Rasmussen | |
| 5,482,802 A | 1/1996 | Celler et al. | |
| 5,592,099 A | 1/1997 | Kuribara et al. | |
| 5,592,100 A | 1/1997 | Shida et al. | |
| 5,640,539 A | 6/1997 | Goishi et al. | |
| 5,673,028 A | 9/1997 | Levy | |
| 5,757,198 A | 5/1998 | Shida et al. | |
| 5,851,413 A | 12/1998 | Casella et al. | |
| 5,854,140 A * | 12/1998 | Jaso et al. | 438/740 |
| 5,948,161 A * | 9/1999 | Kizuki | 117/89 |
| 6,042,738 A | 3/2000 | Casey, Jr. et al. | |
| 6,211,527 B1 | 4/2001 | Chandler | |
| 6,268,608 B1 * | 7/2001 | Chandler | 250/492.2 |
| 6,514,866 B2 | 2/2003 | Russell et al. | |
| 6,645,872 B2 | 11/2003 | Russell et al. | |
| 6,670,610 B2 | 12/2003 | Shemesh et al. | |
| 6,709,554 B2 | 3/2004 | Ferranti et al. | |
| 6,753,538 B2 | 6/2004 | Musil et al. | |
| 6,799,130 B2 | 9/2004 | Okabe et al. | |

(Continued)

FOREIGN PATENT DOCUMENTS

WO  WO9738355  10/1997
WO  WO 0203439 A2 * 1/2002

OTHER PUBLICATIONS

Randolph et al., "Focused Electron-Beam-Induced Etching of Silicon Dioxide," Journal of Applied Physics, vol. 98, Aug. 3, 2005.*

(Continued)

*Primary Examiner* — Shamim Ahmed
*Assistant Examiner* — Bradford Gates
(74) *Attorney, Agent, or Firm* — Scheinberg & Associates, PC; Michael O. Scheinberg; Ki O.

(57) ABSTRACT

A method and apparatus for selective etching a substrate using a focused beam. For example, multiple gases may be used that are involved in competing beam-induced and spontaneous reactions, with the result depending on the materials on the substrate. The gases may include, for example, an etchant gas and an auxiliary gas that inhibits etching.

20 Claims, 5 Drawing Sheets

(56) References Cited

U.S. PATENT DOCUMENTS

| | | |
|---|---|---|
| 6,864,955 B2 | 3/2005 | Nishi et al. |
| 6,867,606 B2 | 3/2005 | Pinto et al. |
| 6,882,745 B2 | 4/2005 | Brankner et al. |
| 7,060,196 B2 | 6/2006 | Makarov et al. |
| 7,109,483 B2 | 9/2006 | Nakasuji et al. |
| 7,241,361 B2 | 7/2007 | Keller et al. |
| 7,504,182 B2 | 3/2009 | Stewart et al. |
| 7,670,956 B2 | 3/2010 | Bret et al. |
| 7,879,730 B2 | 2/2011 | Naser-Ghodsi et al. |
| 2001/0008274 A1* | 7/2001 | Nakasuji ............. 250/492.3 |
| 2002/0020494 A1* | 2/2002 | Yokogawa et al. ......... 156/345 |
| 2004/0121069 A1 | 6/2004 | Ferranti et al. |
| 2004/0226814 A1 | 11/2004 | Stewart et al. |
| 2005/0136682 A1* | 6/2005 | Hudson et al. .............. 438/714 |
| 2006/0045987 A1 | 3/2006 | Chandler et al. |
| 2007/0158588 A1* | 7/2007 | Zhou et al. ............ 250/492.2 |
| 2008/0038928 A1* | 2/2008 | Rueger et al. .............. 438/710 |
| 2008/0314871 A1 | 12/2008 | Toth et al. |
| 2010/0032567 A1 | 2/2010 | Maclou Botman et al. |
| 2010/0264111 A1 | 10/2010 | Makarov |
| 2011/0115129 A1 | 5/2011 | Straw et al. |

OTHER PUBLICATIONS

Orloff, Jon. Handbook of Charged Particle Optics, 1997, pp. 439-453, CRC Press LLC.

Kang, Sang-Woo, et al., "Dry Etching of Copper Film with Hexafluoroacetylacetone via Oxidation Process," J. Vac. Sci. Technol B, Jan./Feb. 1999, pp. 154-157, vol. 17(1).

Steger, Richard, et al., "Chemical Vapor Etching of Copper Using Oxygen and 1,1,1,5,5,5- hexafluoro-2,4-pentanedione," Thin Solids Film, 1999, pp. 221-229, vol. 342.

Toth, Milos, et al., "Electron flux controlled switching between electron beam induced etching and deposition," Journal of Applied Physics, Mar. 7, 2007, 6 pgs. vol. 101, Iss. 5.

* cited by examiner

HIGH SELECTIVITY, LOW DAMAGE ELECTRON-BEAM DELINEATION ETCH

TECHNICAL FIELD OF THE INVENTION

The present invention relates to selective etching using a focused beam, and is particularly applicable to electron beam imaging of cross sections of multi-layered structures.

BACKGROUND OF THE INVENTION

Modern integrated circuits are typically made of multiple layers of materials, such as metals, semiconductors, and insulators, fabricated on semiconductor substrates. To characterize the fabrication process or investigate process problems in semiconductor manufacturing, process engineers often use a focused ion beam to cut a cross section of the integrated circuit and then use a scanning electron microscope to view the edges of the layer in the cross section. For example, process engineers may cut cross sections to observe integrated circuit features, such as poly-silicon gates, amorphous silicon, and various dielectrics and barrier materials and to measure the layer thickness and uniformity.

A scanning electron microscope forms an image by collecting secondary electrons that are emitted from a surface as the beam is scanned across it, with the brightness at each point of the image being proportion to the number of secondary electrons (or another electron signal) collected from the corresponding point on the surface. The number of secondary electrons emitted at each point depends on the type of material and on the topography. Because many different types of materials emit different numbers of secondary electrons per incident electron, it is easy to observe a boundary, for example, between a metal layer and an oxide layer. Some similar materials, such as oxides and nitrides, emit about the same number of secondary electrons for each primary electron, and so the boundary between those materials is often not apparent in the electron beam image.

One method of making the interface visible is to selectively etch the area of the interface. If one material etches more quickly than the other material, there will be a change in topography at the interface, which will be visible in the image. Processing a work piece to make a feature more visible is referred to as "decoration." One decoration process from the assignee of the present invention is referred to as the Delineation Etch™ process, which comprises chemically assisted focused ion beam etching using a fluorinated hydrocarbon vapor of 2,2,2-trifluoroacetamide. When making an interface visible, it is desirable to change the structure as little as possible so that the process engineer obtains an accurate picture of the work piece. Very low etch rates are therefore desirable to allow the process engineer precise control over the decoration process.

As feature sizes in integrated circuits decrease, the inherent damage to the sample caused by ion sputtering introduces measurement error that may not be tolerable. When the decoration is performed using an electron beam instead of an ion beam, physical sputter damage is eliminated. Because of the negligible momentum transfer in electron-beam-induced reactions, an electron beam typically etches only in the presence of an etchant precursor gas.

Background gases in a vacuum chamber often contain carbon and cause carbon deposits during electron beam processing. The electron beam-induced etching must outcompete electron beam-induced deposition from background gases or no etching will occur. Due to its aggressive fluorinating properties, xenon difluoride ($XeF_2$) is often used with an electron beam to etch silicon-containing materials, as well as refractory metals. Unfortunately, $XeF_2$ spontaneously etches silicon at a higher rate than the electron beam-induced etching of silicon dioxide ($SiO_2$). Thus, when attempting to etch $SiO_2$, in the presence of exposed silicon, the gas produces more unintentional damage than desired etching. Moreover, the decoration produced by electron beam etching between layers of different types of dielectrics is inadequate for most applications. For example, electron beam etching with $XeF_2$ etches nitride layers and oxide layers at a similar rate and so an observer cannot readily observe the boundary between those layers. In addition, the overall rate may be too high to have adequate control over the etch depth, even if beam-induced selectivity is observed. To further illustrate this point, consider a very fine nitride feature buried in oxide as the sample to be decorated. In this case, a very soft nitride etch would be preferable (due to small feature size), while more rapidly removing the surrounding oxide. Conversely, the situation could be reversed, where the higher nitride etch rate is preferable. In these types of cases, it is highly desirable to have a specific chemistry capable of providing selectivity for the desired material Another type of use case is where there may be exposed silicon (poly-, amorphous, or single-crystal) that should be preserved in the region of interest to be decorated. In this case, silicon etching is almost solely spontaneous, therefore this case requires more of a spontaneous etch suppression as opposed to a modified beam-induced etch rate. Again, a chemistry capable of all of the above is high desirable.

Another process used in semiconductor manufacturing is reactive ion etching. In reactive ion etching, a wafer is placed in a plasma chamber, where the plasma is comprised of ions, radicals, and neutrals aimed at increasing the gas reactivity. The reactive ions are accelerated toward the wafer surface and react both chemically and by a momentum transfer process. Reactive ion etching occurs on the whole wafer. The reactive ions are not focused, but are created throughout the plasma and accelerated toward the sample. The reaction can be controlled by controlling the gas species, some of which deposit onto the substrate and some of which etch the substrate.

What is needed is a way to selectively induce etching in a small region of a substrate by using a focused beam, so that the etching is controlled by the operation of the beam and by the types of materials on the substrate and is not significantly altered by physical processes such as ion-induced sputtering.

SUMMARY OF THE INVENTION

An object of the invention is to provide an improved method of selectively etching materials on a substrate using a focused beam.

The invention provides a method and apparatus for selectively etching materials on a substrate using a focused beam, such as an electron beam, ion beam, neutral particle beam, or laser beam. Competing reactions, both beam-induced reactions and spontaneous reactions, preferably favor etching of a first material over etching of one or more other materials present on the substrate, thereby allowing etching of the first material while preserving the one or more other materials. In some embodiments, the competing reactions barely favor deposition on one or more of the other materials. The invention is particularly useful for electron-beam-induced delineation of layers of different materials in a cross section while preserving other features of the work piece.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more through understanding of the present invention, and advantages thereof, reference is now made to the following descriptions taken in conjunction with the accompanying drawings, in which:

FIG. 2A shows the relative spontaneous etch rates of the two materials in the presence of an etchant precursor gas. FIG. 2B shows the relative electron-beam induced etch rates of the two materials in the presence of an etchant precursor gas. FIG. 2C shows the relative electron-beam induced etch rates of the two materials in the presence of an etchant precursor gas. FIG. 2D shows the relative electron-beam induced etch rates of the two materials in the presence of an etchant precursor gas and an auxiliary gas.

DETAILED DESCRIPTION OF PREFERRED EMBODIMENTS

Embodiments of the invention provides a method and apparatus for selectively processing materials on a substrate using a focused beam, such as an electron beam, ion beam, neutral particle beam, or laser beam. Using a finely focused beam allows a user to precisely control the region to be processed. For example, modern electron beams can be focused to a spot size of a few nanometers and can be scanned over a region on the order of nanometers up to millimeters. During electron beam processing, a substrate typically has multiple materials exposed to the precursor gases or to the beam. In one preferred embodiment, competing reactions, both spontaneous and beam-induced, favor etching of a first material over etching of one or more other exposed materials. Thus, those embodiments preferentially etch the first material, while preserving or minimizing damage to the other exposed materials.

In some embodiments, two precursor gases are introduced into the region of the work piece. The gas species and the flux of the gases at the work piece are selected so that competing reactions favor, for example, etching of a first material, and the reactions do not favor etching of other materials that are to be preserved. In some embodiments, the competing reactions favor deposition on materials to be preserved. In a preferred embodiment, the deposition process just barely out competes the etching process, so that the preserved material is not etched, but that there is not a significant amount of material deposited. Some preferred embodiments use a high flux of the deposition gas and a low flux of the etchant gas.

Figure 1:
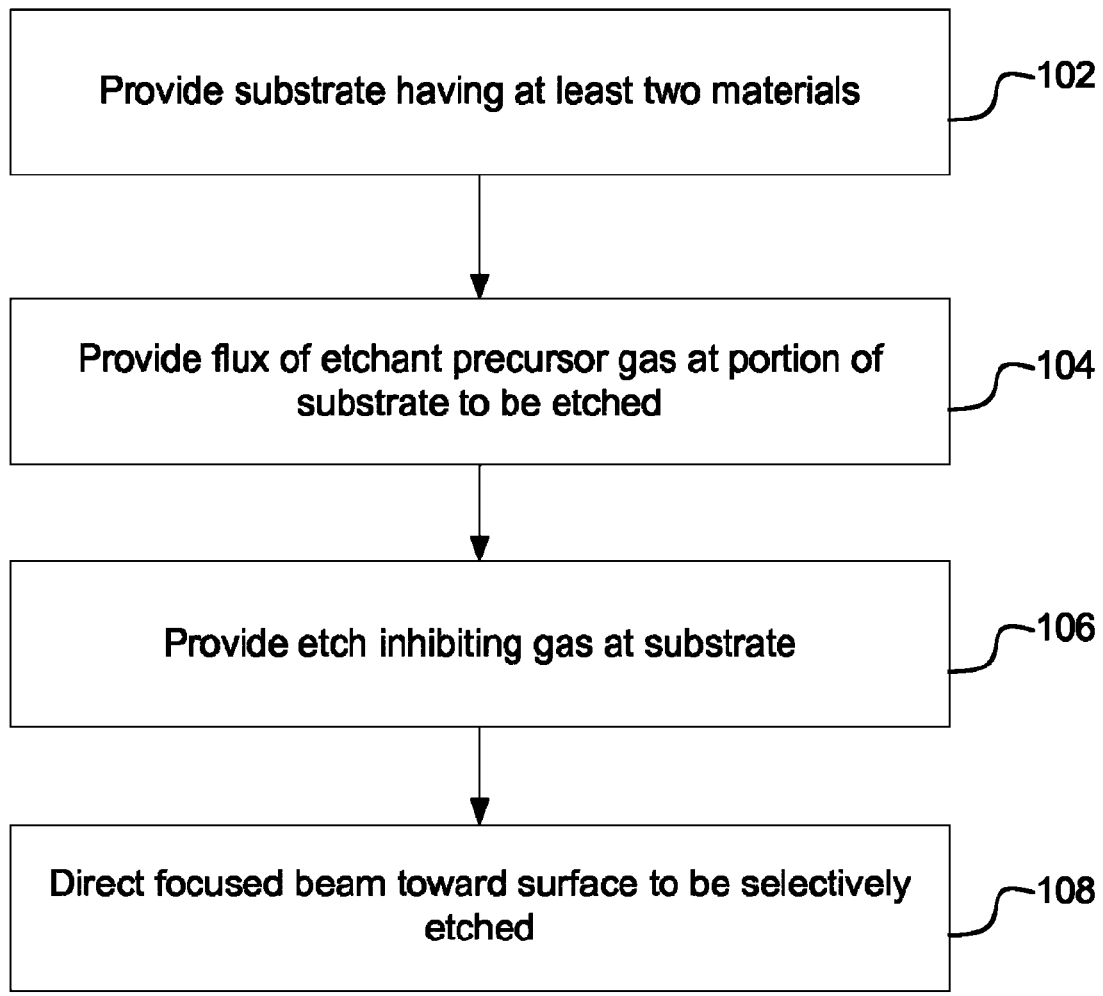
FIG. 1 is a flowchart showing the preferred steps of an embodiment of the present invention.

FIG. 1 is a flow chart showing the steps of a preferred embodiment. In step 102, a substrate having at least two materials is provided. For example, the substrate may be a silicon wafer having fabricated thereon an integrated circuit. The substrate may also include a trench cut by a focused ion beam to expose a cross section of a portion of the integrated circuit. In step 104, a flux of an etchant precursor gas is provided at a portion of the substrate surface to be etched. In step 106, a flux of an etch-inhibiting precursor gas is provided at the substrate surface. In step 108, a focused beam, such as an electron beam is directed toward the substrate over a region that includes at least two materials. The combination of the etch precursor gas, the etch-inhibiting gas, and the focused beam results in the selective etching of a first material over a second material. In some embodiments, a single gas can be used, for example, with an electron beam, to selectively etch one material compared to another material.

Figure 2A:
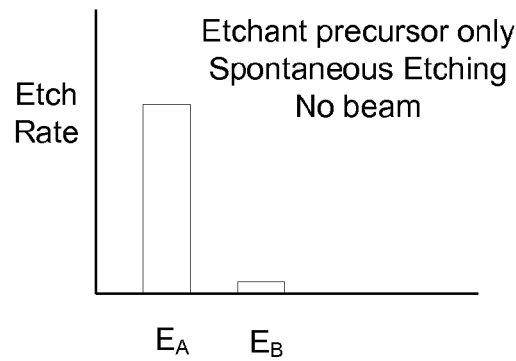
FIG. 2A-2D shows qualitatively (not to scale) the relative etch rates of a system of two materials.
Figure 2B:
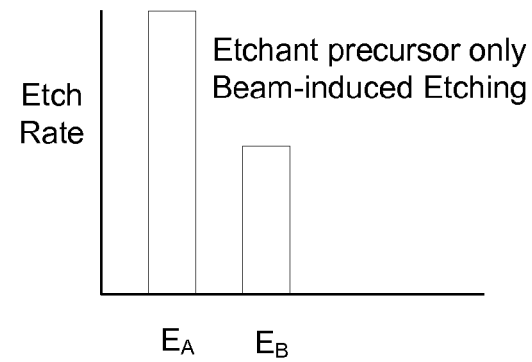

FIGS. 2A through 2D show qualitatively the relative etch rates of a two material system in an embodiment of the invention. A substrate may include materials A and B that are exposed to gases E (primarily an etch precursor) and D (primarily a deposition precursor). Assume that it is desirable to selectively etch material B while preserving material A. In the presence of etch precursor gas E and in the absence of an energy source, such as a focused electron beam, FIG. 2A shows that the etch rate of material A, $E_A$, is much greater than the etch rate of material B, $E_B$. In the presence etch precursor E and of a local energy source, FIG. 2B shows that the etch rate of material B is increased, but the etch rate $E_A$ is still greater than the etch rate $E_B$.

Figure 2C:
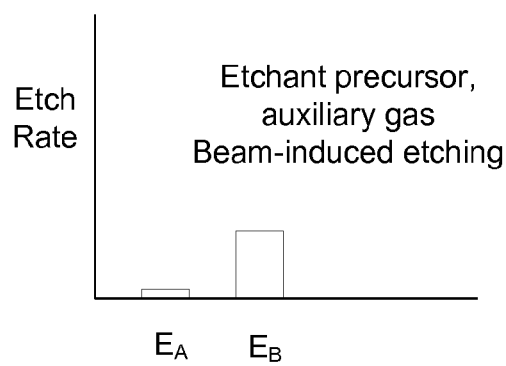
Figure 2D:
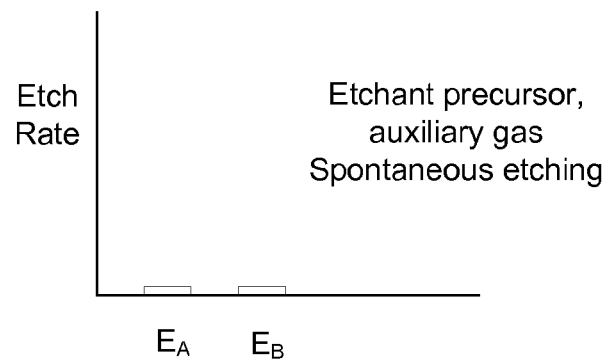

An auxiliary gas is chosen such that the deposition rate, $D_A$, onto material A, is much greater than the deposition rate, $D_B$, onto material B. FIG. 2C shows that the result of the competing spontaneous etching, beam-induced etching, and beam-induced deposition is such that the material B is etched at a faster rate than material A, and material A is essentially preserved. FIG. 2D shows that in the absence of the beam, the etch rate of both materials is very small, so that material A and material B are preserved away from the beam. In one embodiment, material A is silicon nitride or silicon, material B is silicon dioxide, etch gas E is $XeF_2$, and deposition gas D is $CH_3I$, and silicon dioxide is selectively etched over silicon nitride and silicon.

The result of the competing reactions varies with the gas fluxes and the beam energy density. In a Gaussian shaped beam, for example, the result in the center of the beam may differ from the result at the edge of the beam. There is a threshold current density required to switch the dominant reaction from etching to deposition. Skilled persons will be able to empirically determine a workable combination of gas fluxes and energy density to selectively etch the desired material. Additionally, skilled persons will be able to determine gas flux ratios to obtain the desired material selectivity. Because background gases typically contain carbon which can be deposited in the presence of a focused beam, particularly an electron beam, embodiments of the invention are preferably performed in a clean system with minimal background gases.

A preferred application of the invention is delineation of layers in an integrated circuit cross section on a semiconductor substrate. One preferred embodiment includes an electron beam-induced etch process that uses a combination of gases to provide a selective etch, for example, to preferentially etch an oxide layer compared to a nitride layer, while also preserving silicon and polysilicon layers. Using an electron beam provides a "direct write" process, that is, only the region to which the beam is directed is processed, as opposed to wafer scale processing in a technique such as reactive ion etching.

Electron beam processing is preferable to ion beam processing in most decoration applications because the electron beam produces fewer changes to the substrate being observed. For example, most ion beams tend to round the edges of features being observed and can implant ions, which can affect the electrical properties of the circuit. Also, when an electron beam is used to induce etching, a user can observe in real time a high resolution electron beam image of the sample as it is being etched. To observe the image, the etch is preferably performed using an imaging mode, as opposed to a patterning mode. The user can then stop the process when he observes that the layers are sufficiently delineated.

In a preferred embodiment, two gases are introduced into the electron beam vacuum chamber. One gas etches and a second, auxiliary gas, attenuates the etching. The etching of some materials present may be inhibited, for example, by a reaction that deposits a material on the surface of those materials or by a reaction that passivates the surface by forming a compound that does not react with the etchant. The gases may participate in competing etch and deposition reactions, with different reactions favored on different exposed surfaces. The concentration of the different gases and adsorbed species at the sample surface can be controlled, for example, by controlling the gas fluxes and the beam chemistry.

One preferred embodiment of the invention involves the correct proportioning of gas mixtures to allow for electron-beam-induced etching of silicon dioxide while suppressing silicon etching. In some embodiments, $XeF_2$ is injected as an etchant. A fluorocarbon gas is also injected to suppress the etching of silicon and other materials that may be susceptible to $XeF_2$ attack, while allowing silicon dioxide to be etched. The flux of the fluorocarbon is preferably much greater than the flux of the xenon difluoride. By choosing a ratio of gas fluxes to achieve an appropriate fluorine-to-carbon ratio, polymerization on the insulator is inhibited, while it is favored on the silicon, thus allowing for high selectivity and pattern delineation. This beam-induced selectivity provides a means for clearly delineating IC layers while preserving the polysilicon features for measurement.

Without using $XeF_2$, the reaction of the carbon containing gases with the electron beam would result essentially only in the deposition of carbon due to the low efficiency of these gases as electron-beam-induced etchants. The same cannot be said for ion-beam-induced etching with the same etchants. Using just $XeF_2$ does not result in a clear, low-damage delineation of the layers and causes too much damage to silicon features.

In one preferred embodiment, the primary reaction is the formation of volatile $SiF_4$ species from both the $SiO_2$ and Si surfaces. A few of the primary reaction pathways are believed to be as follows:

1. $CF_3I(g)+Si(s)+e- \rightarrow C(s)+Si(s)+3F(g)+I(g)$ [electron beam-induced carbon deposition]
2. $4CF_3I(g)+3Si(s)+e- \rightarrow 3SiF4(g)+4C(s)+4I(g)$ [competitive silicon etching and deposition]
3. $2XeF_2(g)+Si(s) \rightarrow 2Xe(g)+SiF_4(g)$ [spontaneous silicon etching]
4. $2XeF_2(g)+SiO_2+e- \rightarrow 2Xe(g)+SiF_4(g)+O_2(g)$ [electron beam-induced $SiO_2$ etching]

Figure 3:
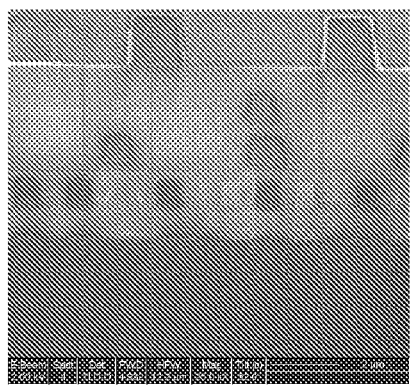
FIG. 3 is a photomicrograph showing a cross section of an integrated circuit before processing a sample in accordance with an embodiment of the invention.
Figure 4:
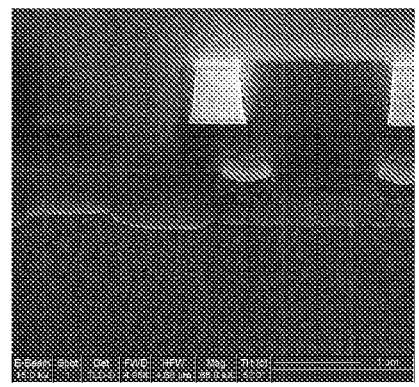
FIG. 4 is a photomicrograph showing the results of processing a sample in accordance with an embodiment of the invention.

FIG. 3 is a photograph of an integrated circuit cross section before processing and FIG. 4 shows an integrated circuit cross section after processing in accordance with the invention. As can be seen in FIG. 4, an observer can distinguish between different interlayers, silicides, polysilicon gates, and nitride barriers. The auxiliary gas, in this case $CF_3I$, protects the polysilicon from aggressive $XeF_2$ damage as well.

$SiO_2$ does not undergo spontaneous etching by $XeF_2$ in the absence of the electron beam, because the electron beam is required to stimulate desorption of oxygen from the $SiO_2$ surface prior to an etching event, and the desorption of oxygen is in most cases the rate-limiting event. By utilizing the competitive carbon deposition on silicon, it is possible to polymerize an etch-stopping carbon layer on the silicon surfaces if the $XeF_2$ flux is very low. However, some level of $XeF_2$ is preferred, because the fluorocarbon gas is not efficient enough of an etchant gas with the electron beam to allow for electron-induced etching alone. The presence of oxygen in $SiO_2$ minimizes the carbon polymerization process due to the reaction:

5. 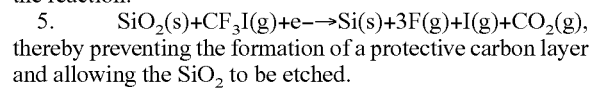 $SiO_2(s)+CF_3I(g)+e- \rightarrow Si(s)+3F(g)+I(g)+CO_2(g)$, thereby preventing the formation of a protective carbon layer and allowing the $SiO_2$ to be etched.

Adding the carbon precursor slows the etching of the $SiO_2$, but slows the etching of the Si even more. The deposition from the $CF_3I$ just out-competes the etch process of the carbon by the $XeF_2$, so that a carbon layer remains to protect the silicon. The Si still etches in some embodiments, but the etch rate is sufficiently slow to prevent significant damage during the time required to etch the $SiO_2$ to delineate the layers. On the silicon oxide, there are two processes that are etching the carbon, so the carbon is removed quickly, allowing the underlying $SiO_2$ to also be etched. The silicon etch is slowed relative to the $SiO_2$ etch and essentially stopped; the $SiO_2$ continues to etch because it is subject to two etching reactions that out compete the carbon deposition reaction. Removal of only about 10 or 20 nm is necessary to make an interface between dielectric layers in a cross section visible.

The selectivity tends to improve as the etch rate decreases. A low etch rate improves process control, but increases processing time. In one embodiment, applicants used the electron beam to observe an area being etched and after about 30 minutes, the layers were visible. While the embodiment described above etches silicon dioxide and inhibits etching of silicon, the invention can be applied to other applications as well, by selecting etchants and auxiliary gases that etch the desired materials while preserving the areas in which etching is not desired.

The electron beam permits local etching as opposed to the whole matter etching of reactive ion etching and the electron beam introduces another controllable reaction component, the electron flux.

The invention can be implemented with a wide variety of gases. Applicants have shown that a combination of $CF_4$ and $XeF_2$ is useable for making visible an interface between $SiO_2$ and SiN, while preserving Si. Other halocarbon gases, particularly other fluorocarbons, can be used with varying levels of carbon. Chlorine gas mixtures may also be useful etching silicon dioxide in the presence of silicon. Molecules having a single carbon are preferred because longer carbon chains will deposit more efficiently and typically at a higher rate so that more carbons in each gas will favor deposition of carbon over etching. Similar processes may involve use of sulfurous fluorides, as well.

While the preferred embodiment is described with respect to an electron beam, the invention can also be implemented using a focused ion beam, such as a beam of gallium ions from a liquid meal ion source or a beam of other ions, such as inert gas ions, from a plasma ion source. Such a plasma source is described, for example, in U.S. Pat. No. 7,241,361 for a "Magnetically Enhanced, Inductively Coupled, Plasma Source for a Focused Ion Beam," which is assigned to the assignee of the present invention. Skilled persons will understand that if an ion beam is used, there will typically be more damage to the substrate. Moreover, ions can implant into the surface and affect the electrical characteristics of a circuit. For example, gallium acts as a p-type dopant in silicon. A beam of light ions, such as hydrogen ions, will cause less damage and will have little or no electrical effect on the circuit. Other embodiments could also use a neutral beam, a laser or beam of a reactive species. Any beam that initiates a reaction in the gas, for example by producing secondary electrons that induce a reaction with an adsorbed gas or by producing photochemical charges in the gas or the substrate, can be used.

The energy of the electrons in the beam is not critical, and may vary, for example from 100 eV to as high as 100 keV, although the efficiency of the primary beam electrons in initiating the reaction varies with the beam energy. Electrons in the beam preferably have an energy of greater than 500 eV. Because electrons do not etch using a momentum transfer process, it is preferably to use a powerful oxidizing agent, like $XeF_2$ with the electron beam. The beam should have a high current density and a low energy for more efficient processing. One embodiment uses a 2 kV beam with a beam current of approximately 3 nanoamps Because $XeF_2$ is a powerful oxidizing agent, the concentration near the sample should be relatively small, while the concentration at the surface of the auxiliary gas, such as $CH_3I$ is preferably greater. One way of achieving a desired gas flux is to introduce the auxiliary gas near the surface, while introducing the $XeF_2$ further from the surface. In one embodiment, two separate gas injection system sources are used. The $XeF_2$ source remains retracted to a distance of about 1½ inches from the sample while the gas is fed externally through a feed through on an inserted GIS equipped with a sidearm. The injection needle of the second gas injection system is inserted to about 100 microns from the surface. Both systems are set so that the ambient chamber pressure of each is about $10^{-5}$ mbar, although the injection needle results in significantly higher pressure at the surface, which is not reflected in this pressure reading. As a result, the auxiliary gas flux will typically be several orders of magnitude higher than the etch gas. In another embodiment, a dual tipped needle is employed on a single $XeF_2$ GIS with the $XeF_2$ having a very short nozzle (essentially retracted) and the fluorocarbon having a standard length nozzle. In another embodiment, the gas could be injected in a coaxial style needle with the outer sheath being shorter than the inner tubing. The etch gas is flowed through the outer sheath and the deposition gas through the inner tube. The shorter outer tube results in lower fluxes of etch gas than the longer, more directed inner deposition gas tube.

The embodiments described above provide a method for suppressing or attenuating spontaneous silicon etching in a $XeF_2$ environment. Such methods are also useful in applications besides delineation dielectric layers. For example, another application of the invention is for "deprocessing," that is, removing layers of a circuit or other structure to expose underlying layers. Deprocessing is used, for example, to expose a buried defect. First, a user would typically use a focused ion beam to remove most of the covering of the defect area, and then a "soft" electron beam process as described above could be used to selectively etch only an oxide layer, while preserving the underlying layers. For example, an electron beam can be directed toward the substrate while $XeF_2$ and $CF_3I$ are also directed toward the substrate, as described above. An oxide layer will be removed, and an underlying silicon layer will be exposed for observation and will be essentially undamaged.

Another use of the invention is for a "circuit edit" process, in which conductors and insulators are cut or deposited to "rewire" an integrated circuit, for example, to determine if a proposed change will correct a design problem, prior to altering the fabrication process of future circuit. In a circuit edit process, it is sometimes desirable to remove excess silicon dioxide. This is currently done using a non-selective $XeF_2$ electron beam etch process. The embodiments described above, directing an etchant gas and an auxiliary gas toward the substrate and directing an electron beam toward the area to be etched, can be used to preserve the exposed silicon and prevent the silicon from being spontaneously etched.

In yet another application of the invention, a gas or combination of gases can be chosen that selectively etches based on dopant profiles. For example, one embodiment could use $CH_3Cl$ (methyl chloride), which spontaneously etches silicon by a reaction that is catalyzed by the dopants. Because the etching reaction is stronger in the region of high dopant concentration, those regions would be selectively etched, while a competing reaction of carbon deposition could be dominant in regions of lower dopant concentration. Other gases that can be used to selectively etch based on dopant profile include methyl iodide, methyl bromide, methyl chloride and their ethyl analogs. P-type and n-type dopants typically catalyze reactions at different rates, and one can take advantage of the different rates to design a system of competing reactions that preferentially etch based on dopant profile. In such an embodiment, the electron beam is directed to the substrate having regions of different dopant concentration. The etchant gas, such as $CH_3Cl$ is also directed toward the substrate. The electron beam induces a reaction between the $CH_3Cl$ in regions of higher dopant concentration, while less reaction occurs in regions of lower dopant concentration, thereby selectively etching based on dopant concentration. In such embodiments, an auxiliary gas may not be needed.

In yet another application, the invention can be used for thinning a sample in preparation for viewing in a transmission electron microscope. For example, a sample may be composed of layers of different materials. An etch process in accordance with the invention can be used to selectively remove a layer, with the etch process stopping when the layer is removed, leaving the sample at the desired thickness. For example, a sample may include a layer of silicon and a layer of an oxide. The electron beam is directed toward the sample in the presence of an etchant gas, such as $XeF_2$ and an auxiliary gas, such as $CF_3I$. The oxide layer will be etched away, and the etch process will essentially stop when the silicon layer is reached, leaving the sample thinned to the silicon layer. In another embodiment, a substance can be deposited on a membrane of a first material, such as a nitride material. The nitride membrane can then be selectively etched away, leaving only the deposited material for viewing in a transmission electron microscope.

When milling with a gallium focused ion beam, the implanted gallium can affect the reactions between the substrate materials and the gases. In a typical cross section that is milled using a gallium beam, the concentration of gallium in the cross section face is relatively high. $XeF_2$ is typically used to decorate a cross section when using a gallium liquid metal ion beam. When an ion plasma source is used and the focused ion beam is composed of, for example, inert gas ions, use of straight fluorinated hydrocarbon or chlorinated hydrocarbon, or fluorinated sulfur-containing compounds, without a strong etchant such as $XeF_2$, may selectively etch the sample to produce the desired results.

Figure 6A:
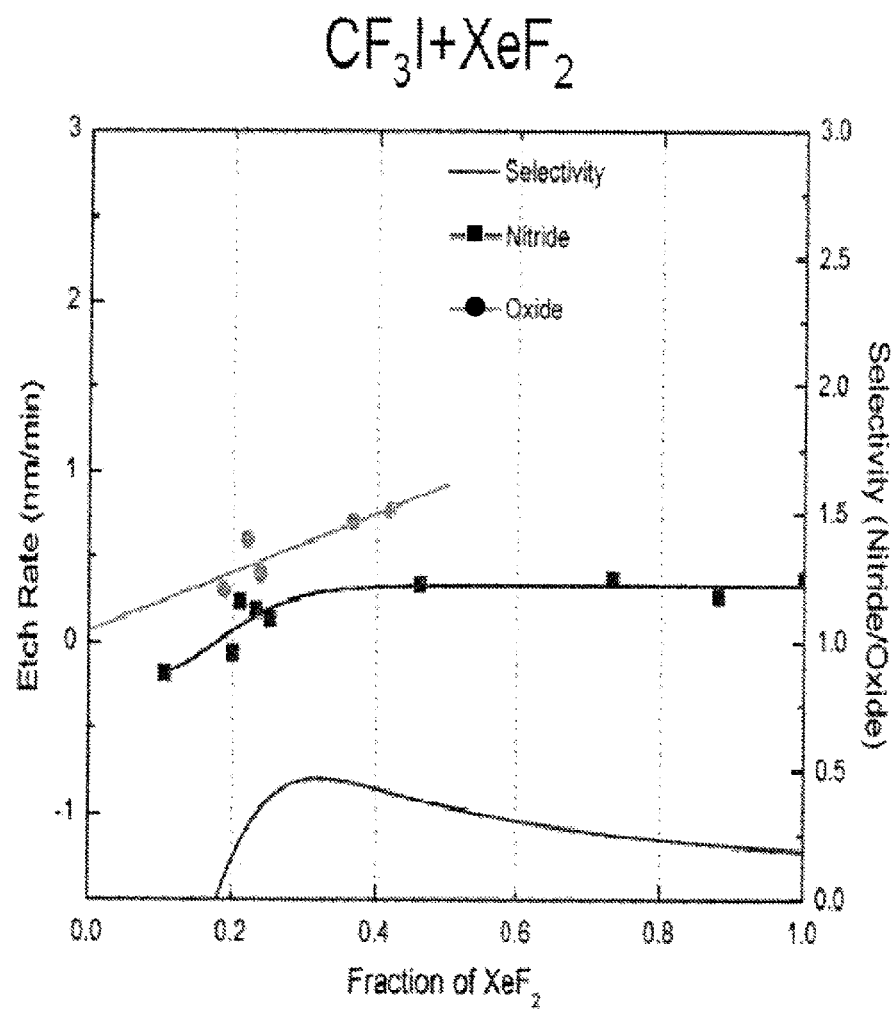
FIGS. 6A and 6B are plots of etch rates and selectivities for $CF_4$ (FIG. 6B) and $CF_3I$ (FIG. 6A) auxiliary gases for a given set of beam conditions and flow geometry.
Figure 6B:
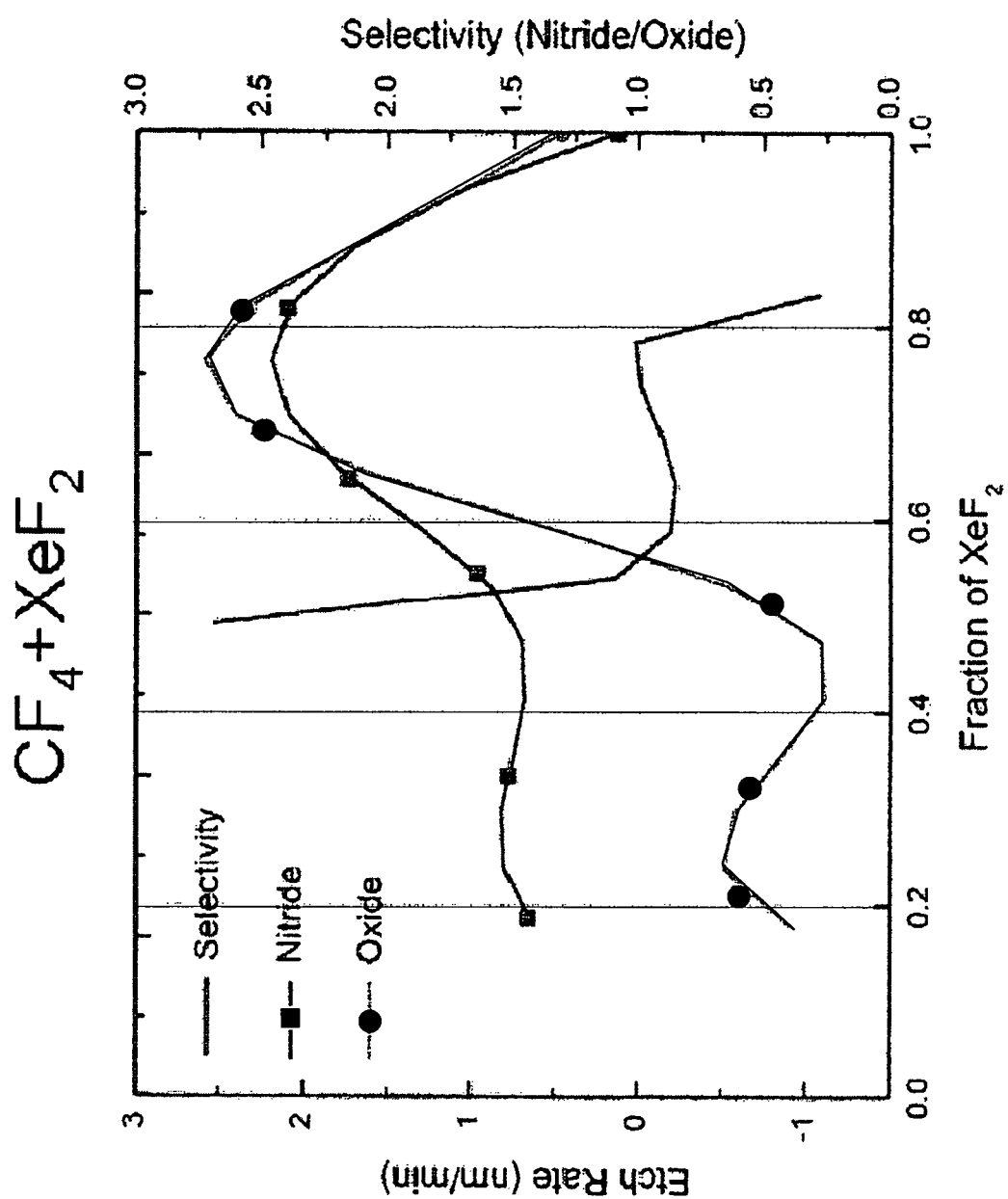

FIGS. 6A and 6B are plots of etch rates of oxides and nitrides and the etch selectivities (etch rate of nitride divided by etch rate of oxide) for $CF_3I$ (FIG. 6A) and $CF_4$ (FIG. 6B) auxiliary gases for a given set of beam conditions and flow geometry. The required selectivity, that is, the ratio of the etch rates, will vary with the application. For decoration, with only a very small amount of material being removed and the etch rate of both materials is relatively low, a relatively low selectivity is acceptable. When more material is to be removed, a higher selectivity is preferred. It is preferable that the selectivity of the etch be greater than 1.1, more preferably greater than 1.2 and even more preferably greater than 1.5. Etch rate selectivities of greater 2 or 3 are preferable in some applications. While described with respect to competing deposition and etching reactions, some embodiments could passivate the surface instead of depositing a material onto the surface.

Figure 5:
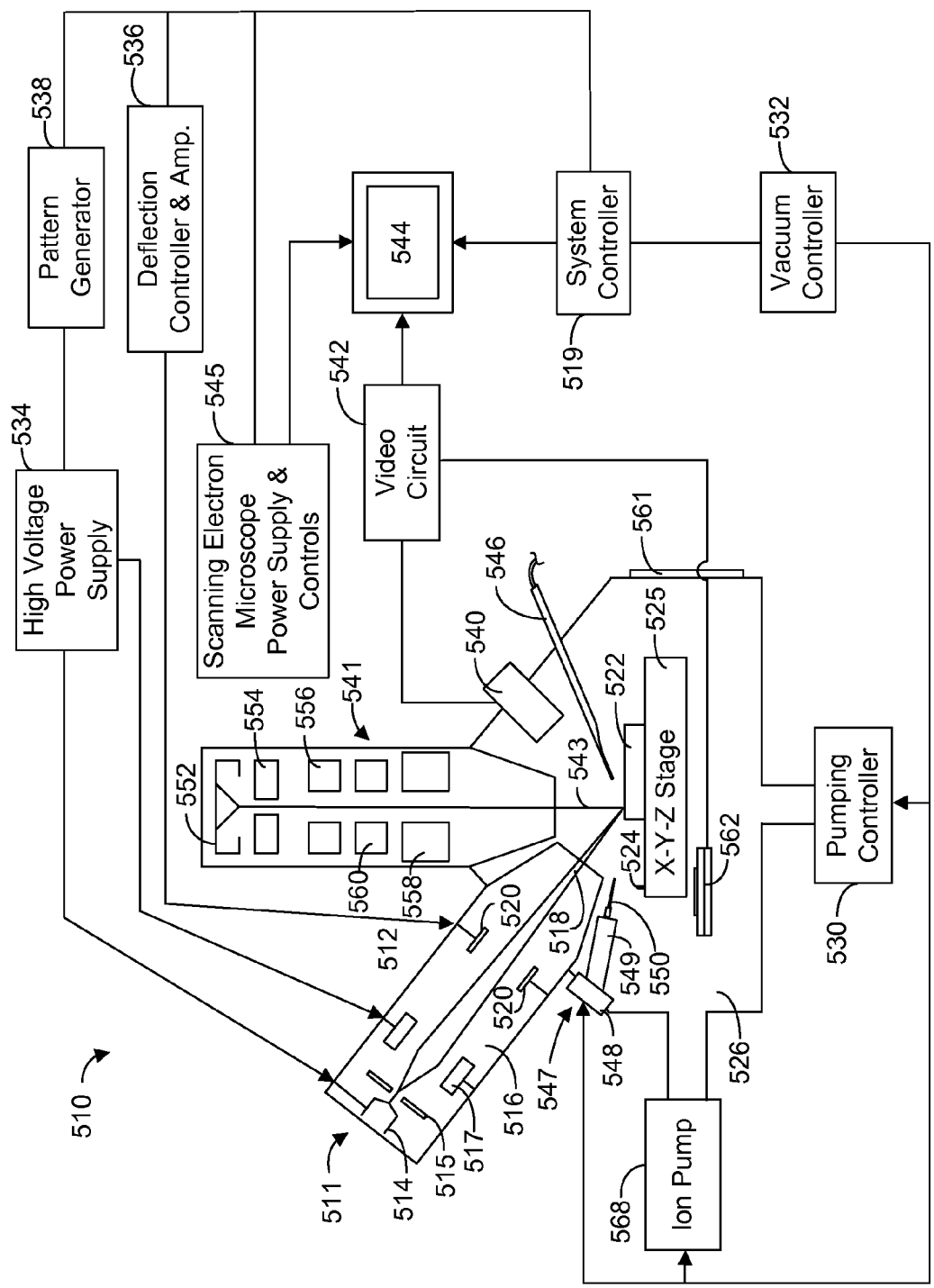
FIG. 5 shows schematically a dual beam system including an ion beam column and an electron beam column useful for practicing the present invention.

FIG. 5 shows a typical dual beam system 510 suitable for practicing the present invention, with a vertically mounted SEM column and a focused ion beam (FIB) column mounted at an angle of approximately 52 degrees from the vertical. Suitable dual beam systems are commercially available, for example, from FEI Company, Hillsboro, Oreg., the assignee of the present application. While an example of suitable hardware is provided below, the invention is not limited to being implemented in any particular type of hardware.

A scanning electron microscope 541, along with power supply and control unit 545, is provided with the dual beam system 510. An electron beam 543 is emitted from a cathode 552 by applying voltage between cathode 552 and an anode 554. Electron beam 543 is focused to a fine spot by means of a condensing lens 556 and an objective lens 558. Electron beam 543 is scanned two-dimensionally on the specimen by means of a deflection coil 560. Operation of condensing lens 556, objective lens 558, and deflection coil 560 is controlled by power supply and control unit 545.

Electron beam 543 can be focused onto substrate 522, which is on movable X-Y stage 525 within lower chamber 526. When the electrons in the electron beam strike substrate 522, secondary electrons are emitted. These secondary electrons are detected by secondary electron detector 540 as discussed below. STEM detector 562, located beneath the TEM sample holder 524 and the stage 525, can collect electrons that are transmitted through the sample mounted on the TEM sample holder as discussed above.

Dual beam system 510 also includes focused ion beam (FIB) system 511 which comprises an evacuated chamber having an upper neck portion 512 within which are located an ion source 514 and a focusing column 516 including extractor electrodes and an electrostatic optical system. The axis of focusing column 516 is tilted 52 degrees from the axis of the electron column. The ion column 512 includes an ion source 514, an extraction electrode 515, a focusing element 517, deflection elements 520, and a focused ion beam 518. Ion beam 518 passes from ion source 514 through column 516 and between electrostatic deflection means schematically indicated at 520 toward substrate 522, which comprises, for example, a semiconductor device positioned on movable X-Y stage 525 within lower chamber 526.

Stage 525 can also support one or more TEM sample holders 524 so that a sample can be extracted from the semiconductor device and moved to a TEM sample holder. Stage 525 can preferably move in a horizontal plane (X and Y axes) and vertically (Z axis). Stage 525 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 561 is opened for inserting substrate 522 onto X-Y stage 525 and also for servicing an internal gas supply reservoir, if one is used. The door is interlocked so that it cannot be opened if the system is under vacuum.

An ion pump 568 is employed for evacuating neck portion 512. The chamber 526 is evacuated with turbomolecular and mechanical pumping system 530 under the control of vacuum controller 532. The vacuum system provides within chamber 526 a vacuum of between approximately $1 \times 10^{-7}$ Torr and $5 \times 10^{-4}$ Torr. If an etch assisting, an etch retarding gas, or a deposition precursor gas is used, the chamber background pressure may rise, typically to about $1 \times 10^{-5}$ Torr.

The high voltage power supply provides an appropriate acceleration voltage to electrodes in ion beam focusing column focusing 516 for energizing and focusing ion beam 518. When it strikes substrate 522, material is sputtered, that is physically ejected, from the sample. Alternatively, ion beam 518 can decompose a precursor gas to deposit a material.

High voltage power supply 534 is connected to liquid metal ion source 514 as well as to appropriate electrodes in ion beam focusing column 516 for forming an approximately 1 keV to 60 keV ion beam 518 and directing the same toward a sample. Deflection controller and amplifier 536, operated in accordance with a prescribed pattern provided by pattern generator 538, is coupled to deflection plates 520 whereby ion beam 518 may be controlled manually or automatically to trace out a corresponding pattern on the upper surface of substrate 522. In some systems the deflection plates are placed before the final lens, as is well known in the art. Beam blanking electrodes (not shown) within ion beam focusing column 516 cause ion beam 518 to impact onto blanking aperture (not shown) instead of substrate 522 when a blanking controller (not shown) applies a blanking voltage to the blanking electrode.

The liquid metal ion source 514 typically provides a metal ion beam of gallium. The source typically is capable of being focused into a sub one-tenth micrometer wide beam at substrate 522 for either modifying the substrate 522 by ion milling, enhanced etch, material deposition, or for the purpose of imaging the substrate 522.

A charged particle detector 540, such as an Everhart Thornley or multi-channel plate, used for detecting secondary ion or electron emission is connected to a video circuit 542 that supplies drive signals to video monitor 544 and receiving deflection signals from controller 519. The location of charged particle detector 540 within lower chamber 526 can vary in different embodiments. For example, a charged particle detector 540 can be coaxial with the ion beam and include a hole for allowing the ion beam to pass. In other embodiments, secondary particles can be collected through a final lens and then diverted off axis for collection.

A micromanipulator 547, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 547 may comprise precision electric motors 548 positioned outside the vacuum chamber to provide X, Y, Z, and theta control of a portion 549 positioned within the vacuum chamber. The micromanipulator 547 can be fitted with different end effectors for manipulating small objects. In the embodiments described herein, the end effector is a thin probe 550.

A gas delivery system 546 extends into lower chamber 526 for introducing and directing a gaseous vapor toward substrate 522. U.S. Pat. No. 5,851,413 to Casella et al. for "Gas Delivery Systems for Particle Beam Processing," assigned to the assignee of the present invention, describes a suitable gas delivery system 546. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

A system controller 519 controls the operations of the various parts of dual beam system 510. Through system controller 519, a user can cause ion beam 518 or electron beam 543 to be scanned in a desired manner through commands entered into a conventional user interface (not shown). Alternatively, system controller 519 may control dual beam system 510 in accordance with programmed instructions. In some embodiments, dual beam system 510 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

While the description above uses the term "etch precursor" and "deposition precursor," skilled persons will recognize that many precursor can either etch or deposit, depending on the gas flux and the beam density.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of making visible in a cross section of an integrated circuit an interface in between an oxide material and a nitride material, comprising:
   exposing a cross section of an integrated circuit by focused ion beam micromachining;
   directing an electron beam toward the exposed cross section; and
   directing a first gas and a second gas toward the exposed cross section, the first gas reacting in the presence of the electron beam to etch a first material of the cross section and the second gas inhibiting etching of a second material of the cross section, the first material including a compound of oxygen and silicon, the second material containing a compound of nitrogen and silicon, the electron beam induced reactions making the etching rate of the first material substantially faster than the second material so that the interface between the first material and the second material is visible in an electron beam image of the cross section and a lower etch rate of the second material is used to differentiate layers that are silicon-oxygen compound and layers that are silicon-nitrogen compound.

2. The method of claim 1 in which:
   the first gas includes a halogen compound; and
   the second gas includes a carbon compound.

3. The method of claim 1 in which the first gas includes xenon difluoride.

4. The method of claim 1 in which the second gas comprises a compound including carbon and a halogen.

5. The method of claim 1 in which the second gas includes $CF_3I$.

6. The method of claim 1 in which directing a second gas toward the substrate includes directing a gas comprising iodomethane.

7. The method of claim 1 in which the first material etches at a rate that is greater than 1.5 times the etch rate of the second material.

8. A method for selectively etching a first material compared to a second material using a focused beam, comprising:
   directing the focused beam toward a cross section of a portion of the substrate, the cross section exposing to view materials having different composition;
   directing a first gas toward a substrate, the first gas reacting in the presence of the focused beam to etch the first material; and
   directing a second gas toward the substrate, the second gas inhibiting the etching of the second material compared to the etching of the first material so that the etching rate of the first material is faster than the etching rate of the second material so that the interface between the materials exposed in the cross section is visible in an electron beam image of the cross section and a lower etch rate of the second material is used to differentiate layers that are silicon-oxygen compound and layers that are silicon-nitrogen compound.

9. The method of claim 8 in which directing a second gas toward the substrate, the second gas inhibiting the etching of the second material compared to the etching of the first material includes directing a second gas that, in combination with the first gas, causes the etch rate of the first material to be at least ten percent faster than the etch rate of the second material.

10. The method of claim 8 in which directing a second gas toward the substrate includes directing a second gas that reacts in the presence of the focused beam to deposit a substance on the second material to reduce the etching of the second material compared to the etching of the first material.

11. The method of claim 8 in which directing a second gas toward the substrate includes directing a second gas having a sticking coefficient and a residence time on the second material, the sticking coefficient and the residence time being sufficient to reduce sticking of molecules of the first gas to the second material, thereby inhibiting etching of the second material.

12. The method of claim 8 in which directing the focused beam toward the substrate includes directing an electron beam toward the substrate.

13. The method of claim 12 in which directing a first gas toward the substrate includes directing a fluoride compound toward the substrate and in which directing a second gas toward the substrate includes directing a carbon compound toward the substrate.

14. The method of claim 13 in which directing a carbon compound toward the substrate includes directing a compound that includes fluorine and carbon.

15. The method of claim 14 in which directing a compound that includes fluorine and carbon includes directing $CF_3I$ or $CF_4$.

16. The method of claim 9 in which directing a second gas toward the substrate includes directing a hydrocarbon gas toward the substrate.

17. The method of claim 16 in which directing a hydrocarbon gas toward the substrate includes directing a gas comprising methane or iodomethane toward the substrate.

18. A method for selectively etching a substrate including a first region having a first dopant concentration and a second region having a second dopant concentration, comprising:
   directing an electron beam toward the substrate;
   providing a gas at the substrate, the electron beam initiating a reaction between the gas and the substrate material, the reaction depending on the dopant concentration such that the etch rate in the first region is greater than the etch rate in the second region wherein an interface between the materials exposed in a cross section is visible in an electron beam image because of the difference in the etching rates.

19. The method of claim 18 in which the reaction is catalyzed by the dopant concentration.

20. The method of claim 19 in which the gas comprises $CH_3Cl$.

* * * * *